(12) United States Patent
Chang et al.

(10) Patent No.: US 7,388,192 B2
(45) Date of Patent: Jun. 17, 2008

(54) IMAGE SENSING MODULE AND PROCESS FOR PACKAGING THE SAME

(75) Inventors: Chia-Shuai Chang, Tao-Yuan Hsien (TW); Chia-Ming Wu, Tao-Yuan Hsien (TW)

(73) Assignee: Impac Technology Co., Ltd., Tao-Yuan Hsien (TW)

( * ) Notice: Subject to any disclaimer, the term of this patent is extended or adjusted under 35 U.S.C. 154(b) by 0 days.

(21) Appl. No.: 11/483,779

(22) Filed: Jul. 11, 2006

(65) Prior Publication Data
US 2007/0029466 A1 Feb. 8, 2007

(30) Foreign Application Priority Data
Jul. 27, 2005 (TW) ............................. 94125364 A

(51) Int. Cl.
H01J 5/02 (2006.01)
H01J 40/14 (2006.01)
H04N 5/225 (2006.01)
G03B 17/02 (2006.01)
H01L 23/02 (2006.01)

(52) U.S. Cl. .................... 250/239; 348/340; 396/535; 396/541; 257/678

(58) Field of Classification Search ................ 250/239, 250/208.1; 257/80–85, 291–294, 432–435, 257/440, 678–733; 348/340; 396/535–541
See application file for complete search history.

(56) References Cited

U.S. PATENT DOCUMENTS

| | | | | |
|---|---|---|---|---|
| 4,390,220 A | * | 6/1983 | Benasutti | 439/71 |
| 5,783,815 A | * | 7/1998 | Ikeda | 250/208.1 |
| 6,014,586 A | * | 1/2000 | Weinberg et al. | 607/36 |
| 6,020,582 A | * | 2/2000 | Bawolek et al. | 250/208.1 |
| 2006/0043514 A1 | * | 3/2006 | Shizuno | 257/434 |

* cited by examiner

Primary Examiner—Georgia Y. Epps
Assistant Examiner—Jennifer Bennett
(74) Attorney, Agent, or Firm—Bacon & Thomas, PLLC

(57) ABSTRACT

An image sensing module includes: a substrate provided with at least two holes at corners and along edges thereof, a plurality of electrically conductive pads arranged in parallel along the edges of the substrate, a plurality of component mounting areas arranged in parallel on the substrate, a plurality of surface mounting components, each of which is mounted on each of the plurality of component mounting areas, an image sensing component mounted on the substrate and surrounded by the plurality of electrically conductive pads and the plurality of the component mounting areas, a cover provided with at least two positioning posts on one face thereof in correspondence with the holes to form a cavity enclosing the plurality of the electrically conductive pads and the plurality of the component mounting areas, the cover being further provided with at least two holes at corners and along edges on the other face thereof, a window fixed on the cover for isolating the module from its surroundings and allowing light to transmit there through, and a lens holder provided with at least two positioning posts for connecting with the holes of the cover.

11 Claims, 9 Drawing Sheets

IMAGE SENSING MODULE AND PROCESS FOR PACKAGING THE SAME

FIELD OF THE INVENTION

The present invention generally relates to an image sensing module and a process for packaging such an image sensing module, and more particularly relates to an image sensing module applicable for a portable mobile device and a process for packaging the same.

BACKGROUND OF THE INVENTION

Image sensing modules are commonly applied to portable mobile devices such as digital still cameras, cellular phones and PDAs (Personal Digital Assistants). Due to the mechanical limitations of those portable mobile devices, when the image sensing modules are applied to the portable mobile devices, custom-made modules are required to fit in the limitations. However, customization contradicts to the demanding requests, such as low cost, quick development and mass production.

Conventionally, an image sensing module is packaged by the following steps: forming a substrate having a cavity with a ceramic or organic material, gluing an image sensing component on the substrate, connecting the above component with electrically conductive pads inside the cavity by means of wire bonding, and covering and gluing the cavity by a window made of a transparent material like glass to obtain a structure which isolates the whole module from its surroundings and allows the light to transmit through the window, as shown in FIG. 1.

For example, Taiwanese Utility Model Patent No. 542,493, "Image Sensor Structure", discloses an image sensor including a substrate, a flange layer, an image sensing chip and a window. The image sensing chip is provided in a recess formed between the flange layer and the substrate. One face of the flange layer is formed with signal inputs which are electrically connected with a plurality of wires, and the image sensing chip is electrically connected with the substrate by way of sides of the flange layer. The surface of the flange layer is partly coated with an adhesive layer for adhesion to the window. The flange layer is fixed to the substrate to form a recess during the process for packaging the image sensor.

Thereafter, the image sensor is soldered to a printed circuit board, and then a lens is installed to form an image sensing module. The processes for assembling such an image sensing module are classified into two fashions. First, the lens holder is glued to or fixed to the printed circuit board with screws, as shown in FIG. 2. Secondly, the lens holder is directly fixed to the image sensor, as shown in FIGS. 3 and 4.

However, some drawbacks accompany both processes. The first process is simpler to make an image sensing module, yet the area required by the module is larger. Further, surface mounting technology (referred to SMT hereinafter) and a printed circuit board (referred to PCB hereinafter) are utilized to conduct positioning between the lens and the image sensor, and therefore the error is relatively large. In the second process, the characteristics of the image sensing module vary subject to different positioning references, either on the glass or along the edge of the substrate. Furthermore, in this process, a larger transporting error occurs since the shape of the glass or the substrate is generally square and thus larger clearance between the lens and the edges of the glass/substrate is required. Additionally, since the lens holder is directly mounted on the glass, the tilting error of the whole image sensing module increases due to the error between the lens and the glass.

The present invention is proposed to eliminate the drawbacks of the prior art, and makes the following possible: smaller modules, smaller transporting and tilting errors, higher yields, better aligning precisions, lower costs, and implementation of a modulized design and a process without any precise positioning equipment.

SUMMARY OF THE INVENTION

A main object of the present invention is to provide a process for packaging an image sensing module, which utilizes a plurality of holes and positioning posts to achieve precise positioning required by the image sensing module. Thus, smaller modules, lower transporting and tilting errors, higher yields, better aligning precisions, lower costs, and a modulized design and a process without any precise positioning equipment can be obtained.

To achieve the above object, the present invention proposes an image sensing module including a substrate provided with at least two holes at corners and along edges thereof; a plurality of electrically conductive pads arranged in parallel along the edges of the substrate; a plurality of component mounting areas arranged in parallel on the substrate; a plurality of surface mounting components, each of which is mounted on each of the plurality of component mounting areas; an image sensing component mounted on the substrate and surrounded by the plurality of electrically conductive pads and the plurality of component mounting areas; a cover provided with at least two positioning posts on one face thereof in correspondence with the holes to form a cavity enclosing the plurality of electrically conductive pads and the plurality of component mounting areas, the cover further provided with at least two holes at corners and along edges on the other face thereof; a window fixed on the cover for isolating the module from its surroundings and allowing light to transmit therethrough; and a lens holder provided with at least two positioning posts for connecting with the holes of the cover.

According to an aspect of the present invention, the substrate is made of a ceramic.

According to an aspect of the present invention, the substrate is made of an organic material.

According to an aspect of the present invention, the cover is made of a ceramic.

According to an aspect of the present invention, the cover is made of an organic material.

According to an aspect of the present invention, the plurality of surface mounting components are mounted on the plurality of component mounting areas by SMT.

According to an aspect of the present invention, the image sensing component is mounted on the substrate by means of die bonding.

According to an aspect of the present invention, the image sensing component is connected with the plurality of the electrically conductive pads by means of wire bonding.

According to an aspect of the present invention, the substrate is selected from a group consisting of a printed circuit board, a sintering ceramic substrate and a low temperature cofired ceramic substrate.

According to an aspect of the present invention, the cover is obtained by means of injection molding.

According to an aspect of the present invention, the window is made of glass.

To achieve the above object, the present invention proposes a process for packaging the image sensing module, comprising the following steps of: a) forming a plurality of electrically conductive pads, a plurality of component mounting areas and circuits for interconnecting said pads and said areas on a substrate; b) mounting a plurality of surface mounting components on the plurality of component mounting areas; c) mounting an image sensing component on the substrate; d) connecting the image sensing component with the plurality of electrically conductive pads; e) gluing a window on a cover; f) aligning positioning posts of the cover with holes of the substrate, and inserting the positioning posts into the holes to form a cavity for enclosing the plurality of electrically conductive pads and the plurality of component mounting areas; and g) aligning positioning posts of a lens holder with holes of the cover, and inserting the positioning posts into the holes.

DETAILED DESCRIPTION OF THE PREFERRED EMBODIMENTS

The features and advantages of the present invention will become better understood with regard to the following embodiments. It is understood to those skilled in the art that the present disclosure of embodiments will be made by means of examples only and that numerous changes in the arrangement and combination of parts may be resorted without departing from the spirit and scope of the invention as claimed.

Figure 1:
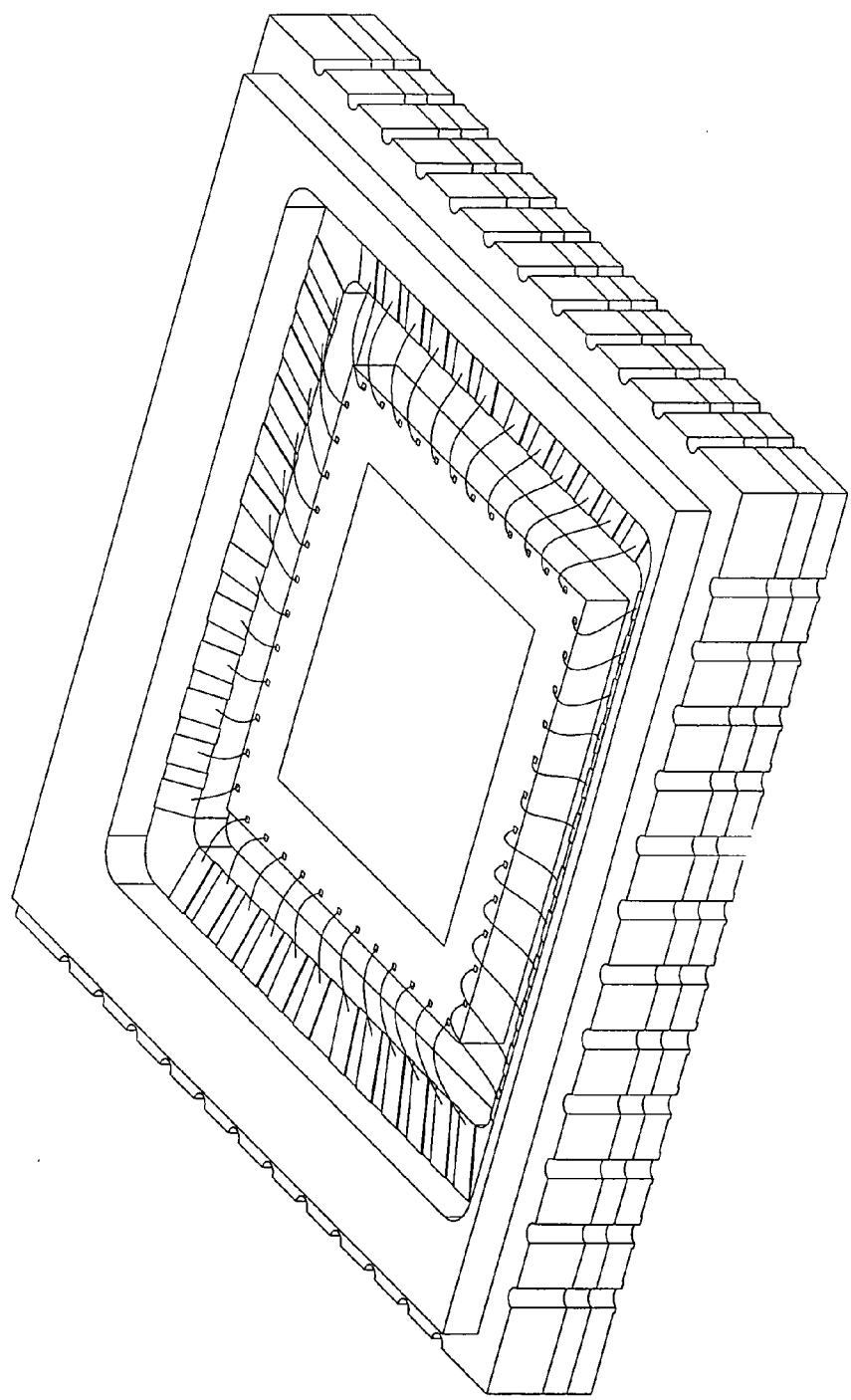
FIG. 1 schematically shows a prior art substrate utilized for packaging an image sensor module.
Figure 2:
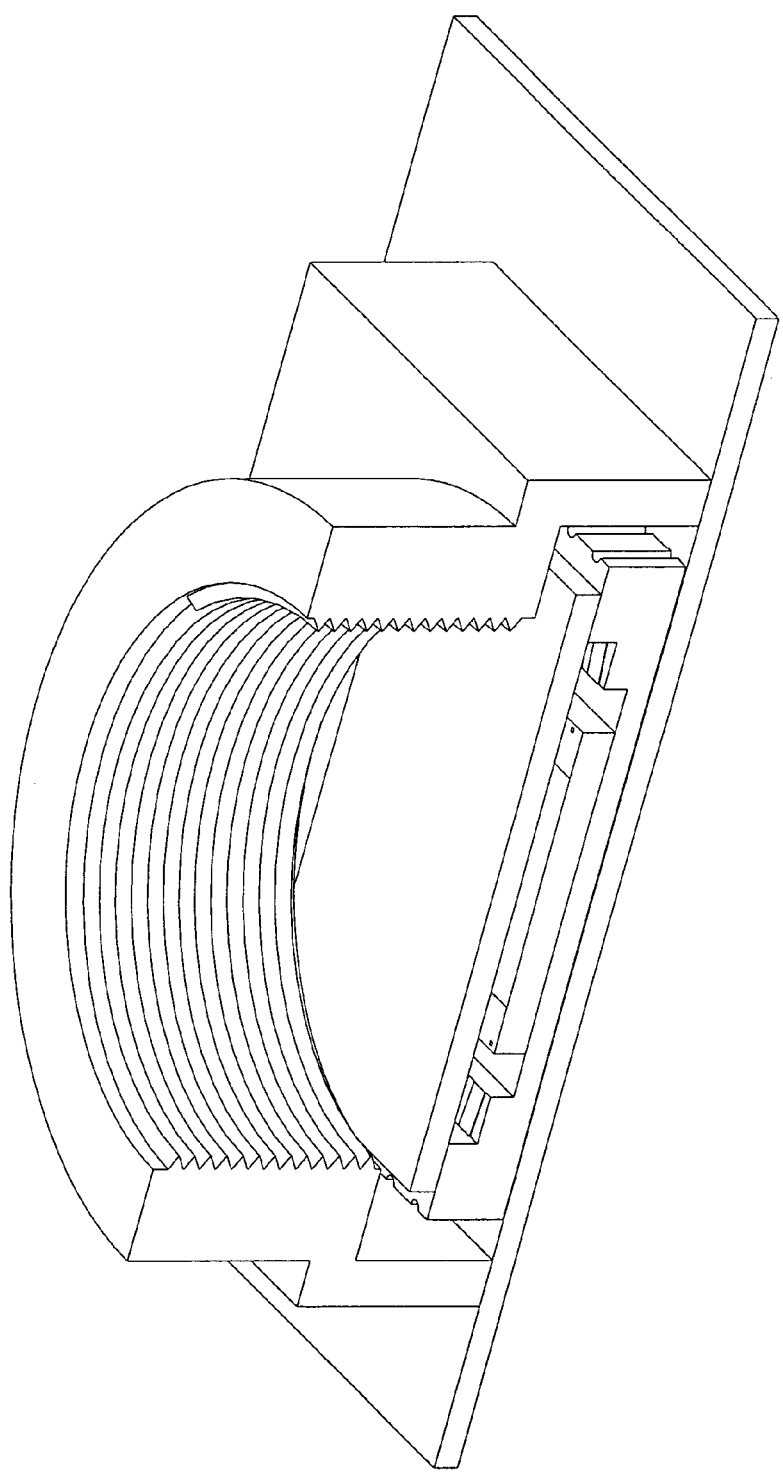
FIG. 2 schematically shows a prior art substrate utilized for packaging an image sensor module in combination with a lens holder.
Figure 3:
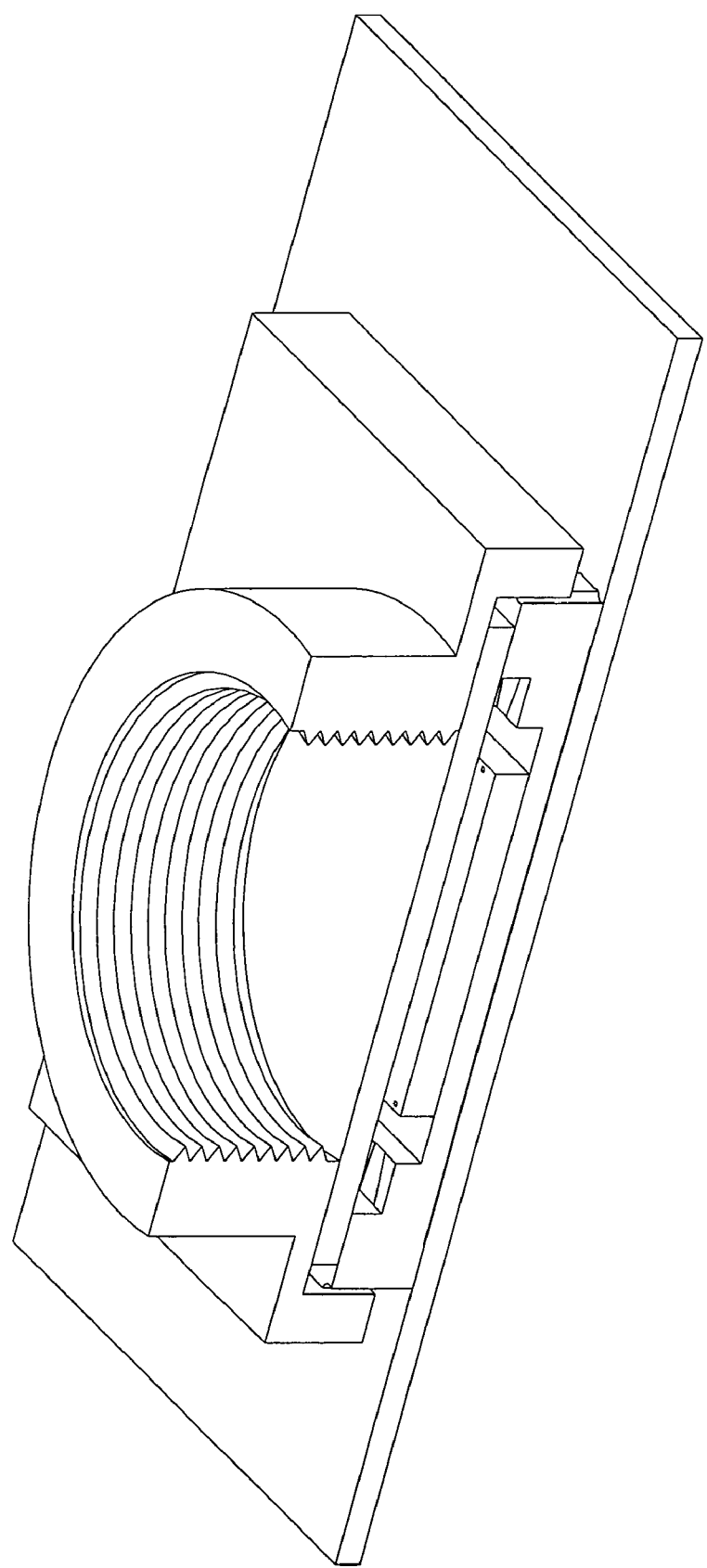
FIG. 3 schematically shows a prior are substrate utilized for packaging an image sensor module in combination with a lens holder.
Figure 4:
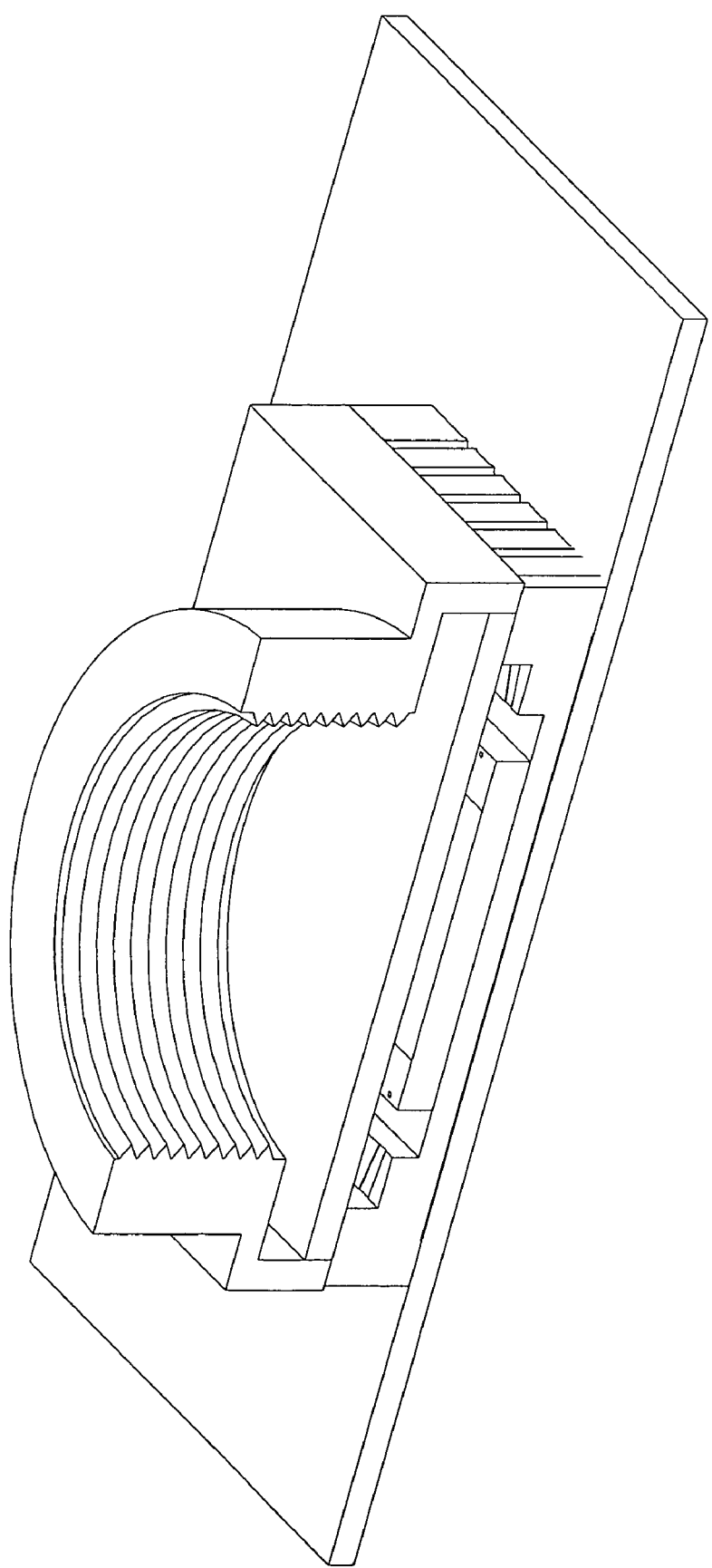
FIG. 4 schematically shows a prior art substrate utilized for packaging an image sensor module in combination with a lens holder.
Figure 5:
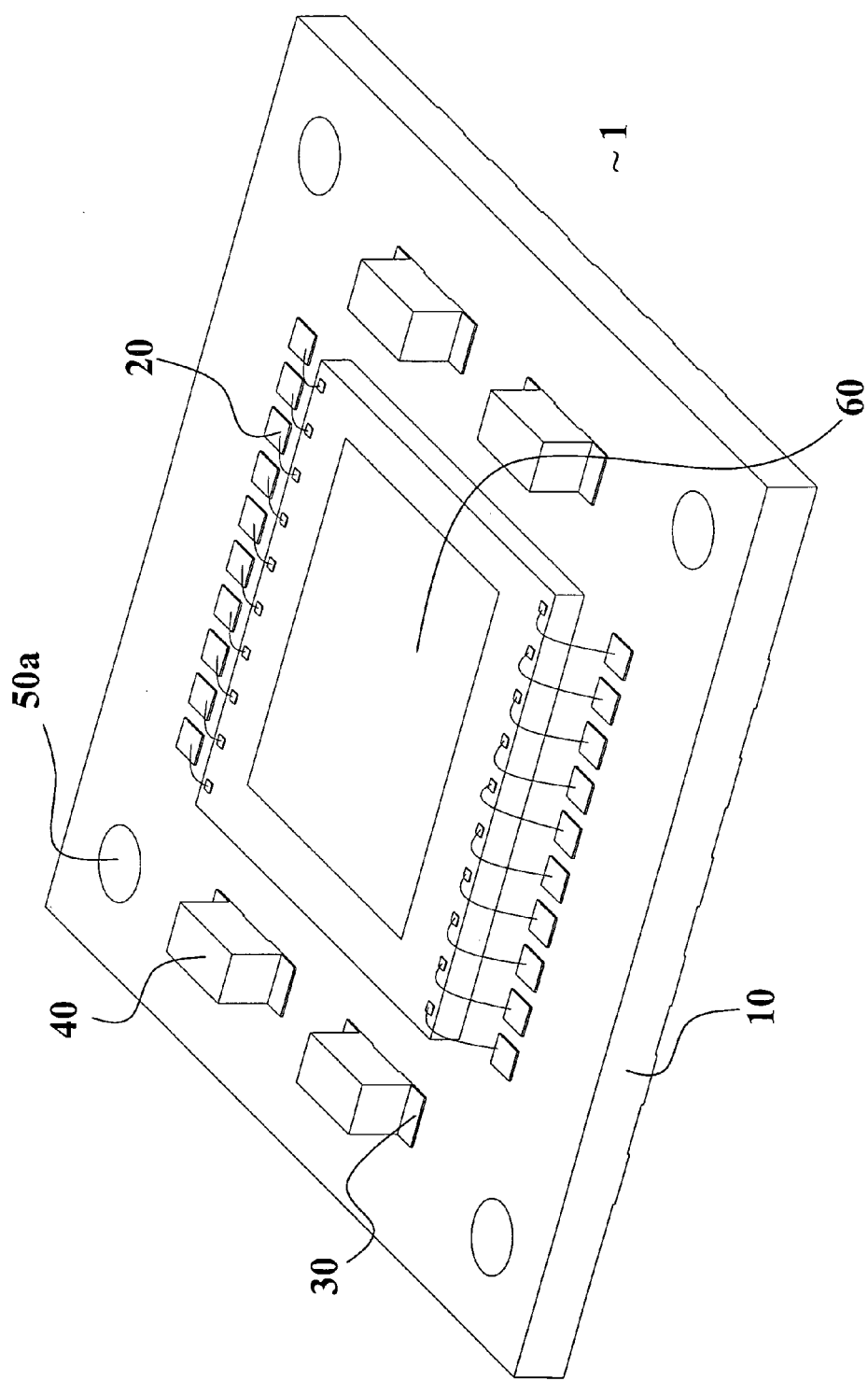
FIG. 5 demonstrates an image sensing module according to an embodiment of the present invention.

FIG. 5 is a schematic view showing an image sensing module according to an embodiment of the present invention. As shown in FIG. 5, the image sensing module 1 comprises a substrate 10, a plurality of electrically conductive pads 20, a plurality of component mounting areas 30, a plurality of surface mounting components 40, an image sensing component 60, a cover 80, a window 90, and a lens holder 100.

Figure 6:
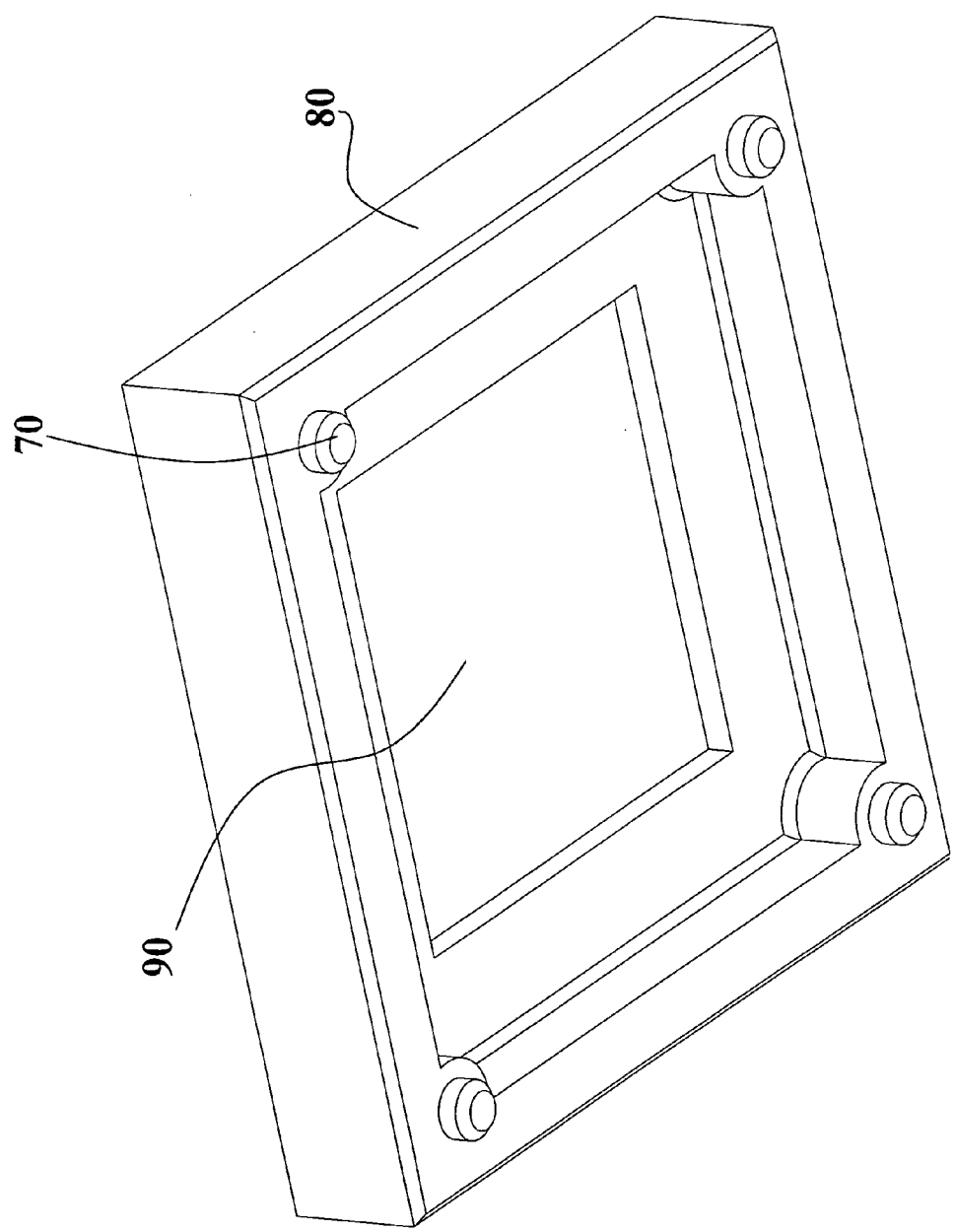
FIG. 6 is a bottom view showing a cover utilized for an image sensing module according to an embodiment of the present invention.
Figure 7:
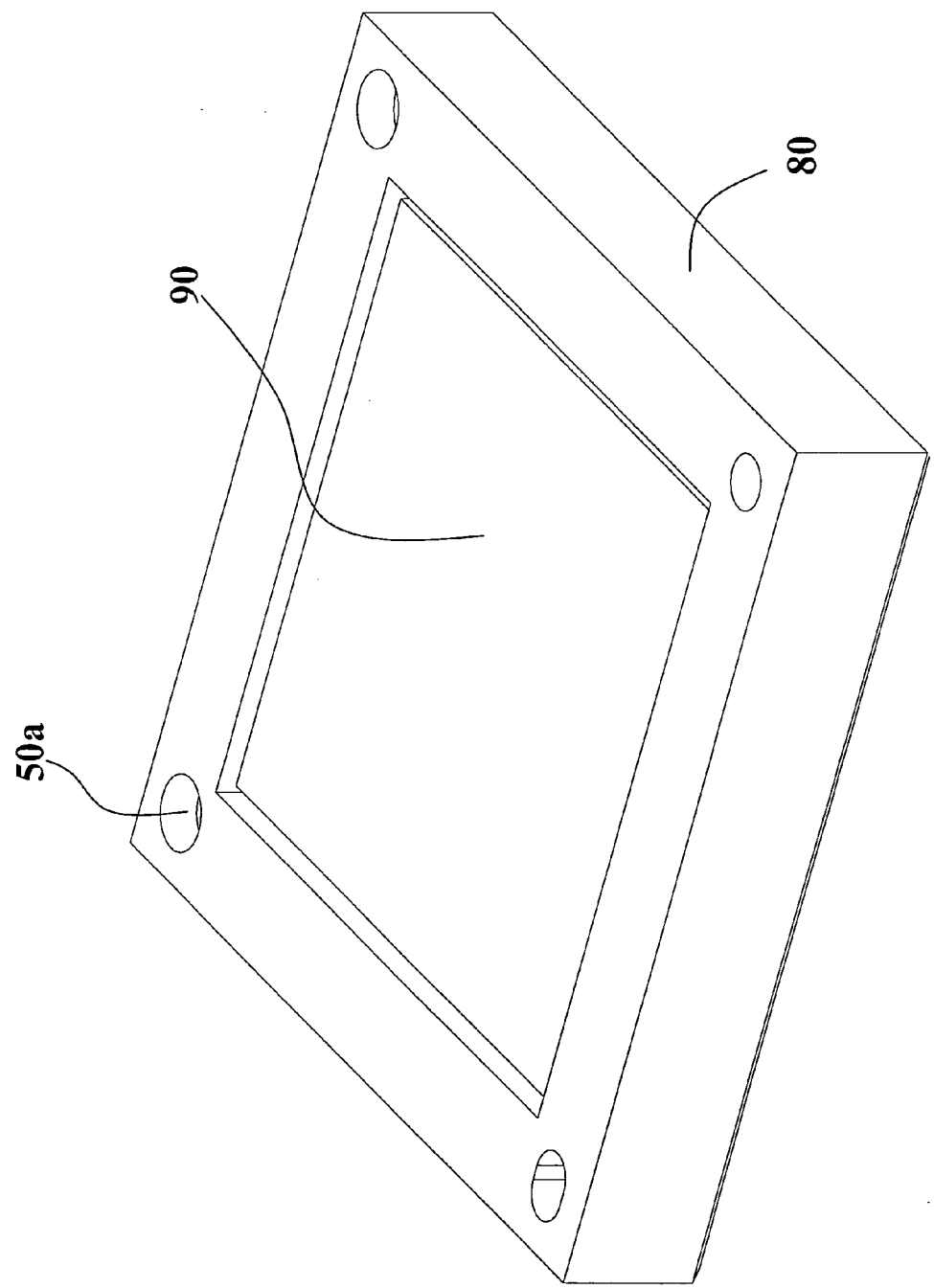
FIG. 7 is a top view showing a cover utilized for an image sensing module according to an embodiment of the present invention.
Figure 8:
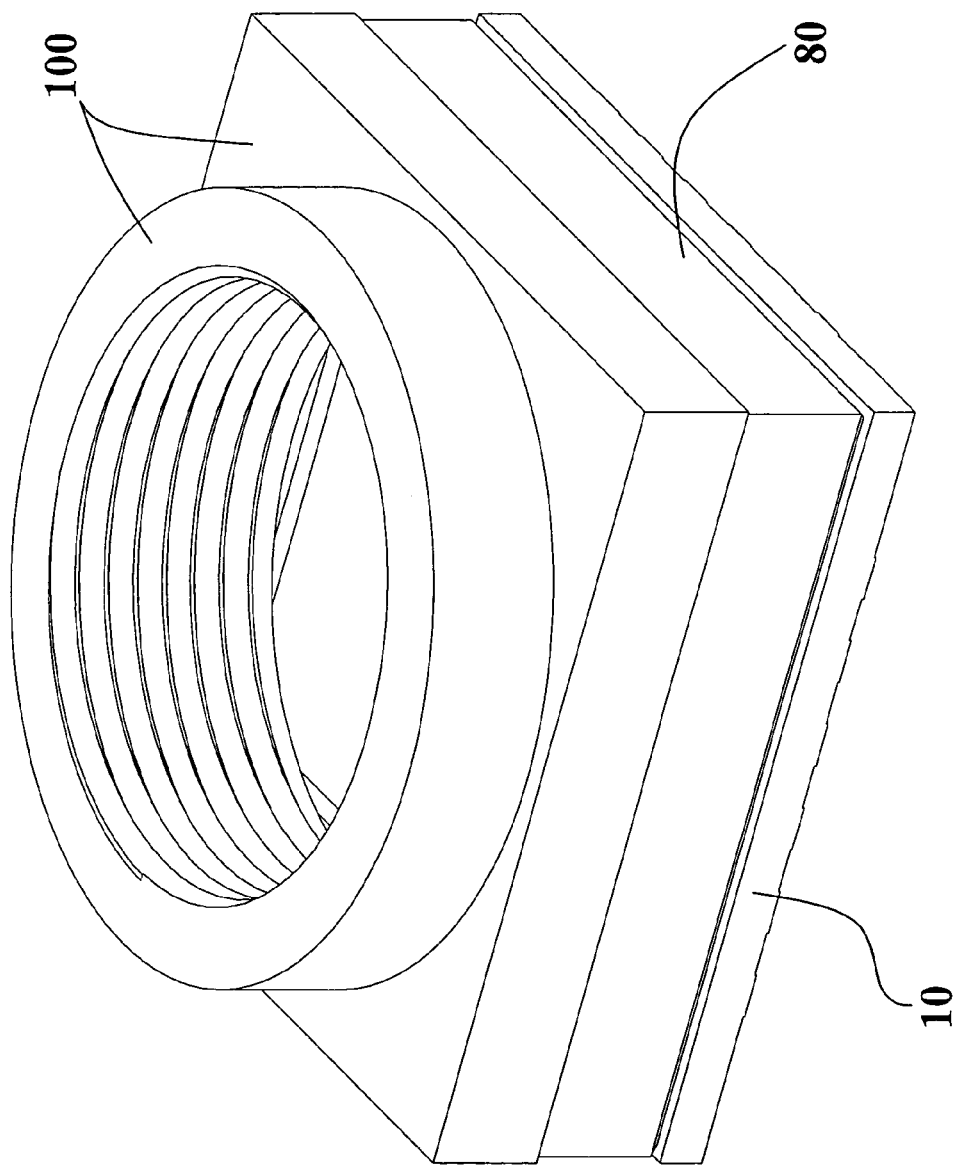
FIG. 8 depicts an image sensing module in combination with a lens holder after packaging according to an embodiment of the present invention.

The substrate 10 is made of a ceramic or organic material, and the electrically conductive pad 20, and the component mounting areas 30 can be fabricated on the substrate within edges of the substrate during process for manufacturing a printed circuit board, a sintering ceramic substrate or a LTCC (Low Temperature Cofired Ceramic) substrate. The surface mounting components 40 are mounted on the component mounting areas 30 located on the substrate 10 by SMT. The image sensing component 60 is mounted on the substrate 10 by means of die bonding, and then connected with the electrically conductive pads 20 by means of wire bonding. Further, the substrate 10 is provided with at least two holes 50a located at corners and along edges thereof to be connected with positioning posts 70. The cover 80 is made of a ceramic or organic material, and provided with positioning posts 70 located at corners and along edges thereof to be connected with the holes 50a of the substrate 10 to form a cavity enclosing the electrically conductive pads 20 and the component mounting areas 30. The cover 80 is further provided with at least two holes 50b located at corners and along edges on the other face thereof to be connected with positioning posts (not shown) of the lens holder 100. These posts are similar with the positioning posts 70 of the cover 80, as shown in FIG. 6. The cover 80 is substantially obtained by means of injection molding. The window 90 is glued to the cover 80 to accommodate the electrically conductive pads 20, component mounting areas 30, surface mounting components 40 and the image sensing component 60 inside the cover 80, and prevent the image sensing component 60 from contamination caused by vapor, dust and micro particles. The window 90 can be made of any transparent materials, for example glass, allowing light to transmit therethrough, and thus the image sensing component 60 can receive optical signals via the window 90.

Figure 9:
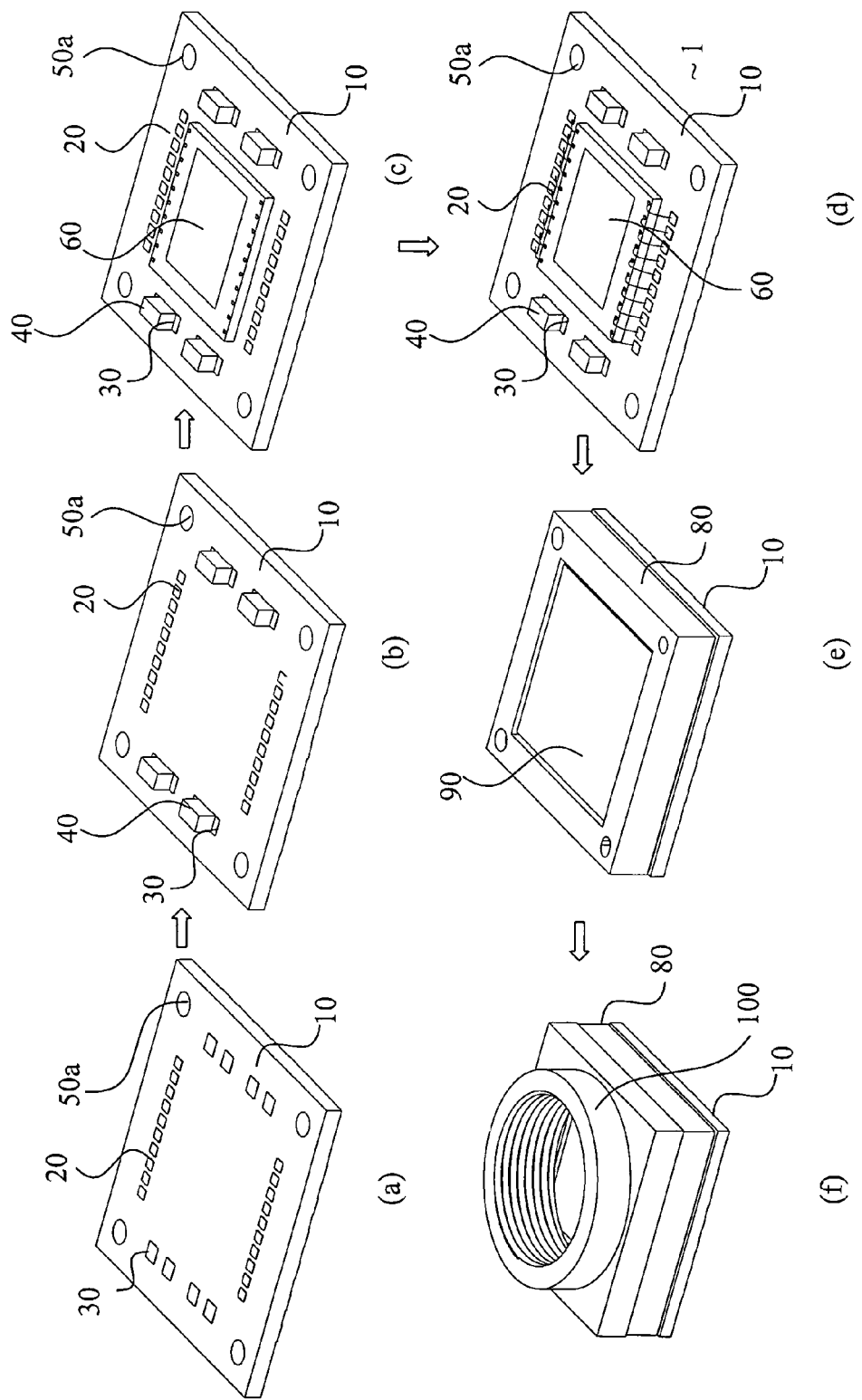
FIG. 9 shows a process for packaging an image sensing module according to an embodiment of the present invention.

FIG. 9 illustrates a process for packaging the image sensing module 1 according to an embodiment of the present invention step by step. As shown FIG. 9, A substrate 10 having electrically conductive pads 20 and component mounting areas 30 arranged along edges thereof is prepared. Surface mounting components 40 are mounted on component mounting areas 30 on the substrate 10 by SMT. An image sensing component 60 is mounted on the substrate 10 by means of die bonding. The image sensing component 60 is connected with the electrically conductive pads by means of wire bonding. A window 90 is glued on a cover 80 in advance. Next, positioning posts 70 of the cover 80 (obtained by means of injection molding) are aligned with holes 50a of the substrate 10, and the posts 70 are glued to the substrate 10 to form a cavity enclosing the electrically conductive pads 20 and component mounting areas 30. Then, the positioning posts (not shown) of a lens holder 100 are aligned with holes 50b of the cover 80, and the window 90 made of a transparent material is fixed to the cover 80 located above the substrate 10.

It is clear that smaller modules, smaller transporting and tilting errors, higher yields, better aligning precisions, lower costs, a modulized design and a process without any precise positioning equipment can be obtained by utilizing the process for packaging the image sensing module 1, which overcomes the drawbacks existing in the prior art.

It should be noted that people skilled in the art can obtain various modifications without departing from the spirits and the scopes of the appended claims.

What is claimed is:

1. An image sensing module comprising:
   a substrate provided with at least two holes at corners and along edges thereof;
   a plurality of electrically conductive pads arranged in parallel along said edges of said substrate;

a plurality of component mounting areas arranged in parallel on said substrate;

a plurality of surface mounting components, each of which is mounted on each of said plurality of component mounting areas;

an image sensing component mounted on said substrate and surrounded by said plurality of electrically conductive pads and said plurality of component mounting areas;

a cover provided with at least two positioning posts on one face thereof in correspondence with said holes to form a cavity enclosing said plurality of electrically conductive pads and said plurality of component mounting areas, said cover being further provided with at least two holes at corners and along edges on the other face thereof;

a window fixed on said cover for isolating said module from its surroundings and allowing light to transmit therethrough; and a lens holder provided with at least two positioning posts for connecting with said holes of said cover.

2. The image sensing module as recited in claim 1, wherein said substrate comprises a ceramic.

3. The image sensing module as recited in claim 1, wherein said substrate comprises an organic material.

4. The image sensing module as recited in claim 1, wherein said cover comprises a ceramic.

5. The image sensing module as recited in claim 1, wherein said cover comprises an organic material.

6. The image sensing module as recited in claim 1, wherein said plurality of surface mounting components are mounted on said plurality of component mounting areas by surface mounting technology.

7. The image sensing module as recited in claim 1, wherein said image sensing component is mounted on said substrate by means of die bonding.

8. The image sensing module as recited in claim 1, wherein said image sensing component is connected with said plurality of electrically conductive pads by means of wire bonding.

9. The image sensing module as recited in claim 1, wherein said substrate is selected from a group consisting of a printed circuit board, a sintering ceramic substrate and a low temperature cofired ceramic substrate.

10. The image sensing module as recited in claim 1, wherein said cover is obtained by means of injection molding.

11. The image sensing module as recited in claim 1, wherein said window is made of glass.

* * * * *